US008108737B2

(12) United States Patent
Stenfort

(10) Patent No.: US 8,108,737 B2
(45) Date of Patent: Jan. 31, 2012

(54) SYSTEM, METHOD, AND COMPUTER PROGRAM PRODUCT FOR SENDING FAILURE INFORMATION FROM A SERIAL ATA (SATA) SOLID STATE DRIVE (SSD) TO A HOST DEVICE

(75) Inventor: Ross John Stenfort, Los Altos, CA (US)

(73) Assignee: SandForce, Inc., Milpitas, CA (US)

( * ) Notice: Subject to any disclaimer, the term of this patent is extended or adjusted under 35 U.S.C. 154(b) by 93 days.

(21) Appl. No.: 12/573,792

(22) Filed: Oct. 5, 2009

(65) Prior Publication Data

US 2011/0083047 A1    Apr. 7, 2011

(51) Int. Cl.
*G06F 11/00*    (2006.01)
(52) U.S. Cl. .............. 714/57; 714/48; 714/42
(58) Field of Classification Search .......... 714/42, 714/48, 57
See application file for complete search history.

(56) References Cited

U.S. PATENT DOCUMENTS

| | | | |
|---|---|---|---|
| 5,485,595 A | 1/1996 | Assar et al. ............... 395/430 |
| 5,544,356 A | 8/1996 | Robinson et al. .......... 395/600 |
| 5,568,423 A | 10/1996 | Jou et al. .................. 365/185.33 |
| 5,568,626 A | 10/1996 | Takizawa ................... 395/430 |
| 5,621,687 A | 4/1997 | Doller ...................... 365/185.29 |
| 5,819,307 A | 10/1998 | Iwamoto et al. ............. 711/103 |
| 5,835,935 A | 11/1998 | Estakhri et al. ............. 711/103 |
| 5,881,229 A | 3/1999 | Singh et al. .............. 395/200.33 |
| 5,956,473 A | 9/1999 | Ma et al. ................ 395/182.03 |
| 5,963,970 A | 10/1999 | Davis ...................... 711/103 |
| 6,000,006 A | 12/1999 | Bruce et al. ............... 711/103 |
| 6,154,808 A | 11/2000 | Nagase et al. ............. 711/103 |
| 6,230,233 B1 | 5/2001 | Lofgren et al. ............. 711/103 |
| 6,405,295 B1 | 6/2002 | Bando .................... 711/165 |
| 6,539,453 B1 | 3/2003 | Guterman ................. 711/103 |
| 6,600,614 B2 * | 7/2003 | Lenny et al. ............... 360/31 |
| 6,694,402 B1 | 2/2004 | Muller .................... 711/103 |
| 6,732,221 B2 | 5/2004 | Ban ...................... 711/103 |
| 6,831,865 B2 | 12/2004 | Chang et al. ............. 365/185.33 |
| 6,914,853 B2 | 7/2005 | Coulson .................. 365/236 |
| 6,925,523 B2 | 8/2005 | Engel et al. .............. 711/103 |
| 6,948,026 B2 | 9/2005 | Keays .................... 711/103 |
| 6,973,531 B1 | 12/2005 | Chang et al. .............. 711/103 |
| 6,985,992 B1 | 1/2006 | Chang et al. .............. 711/103 |
| 7,000,063 B2 | 2/2006 | Friedman et al. ........... 711/103 |
| 7,003,623 B2 * | 2/2006 | Teng ...................... 711/104 |
| 7,032,087 B1 | 4/2006 | Chang et al. .............. 711/156 |
| 7,035,967 B2 | 4/2006 | Chang et al. .............. 711/103 |
| 7,096,313 B1 | 8/2006 | Chang et al. .............. 711/103 |
| 7,103,732 B1 | 9/2006 | Chang et al. .............. 711/156 |
| 7,120,729 B2 | 10/2006 | Gonzalez et al. ........... 711/103 |
| 7,549,013 B2 * | 6/2009 | Estakhri et al. ............ 711/103 |
| 7,620,747 B1 * | 11/2009 | Overby et al. ............. 710/22 |

(Continued)

OTHER PUBLICATIONS

Olson, Alan R and Denis J Langlois, Solid State Drives Data Reliability and Lifetime, Apr. 7, 2008, Imation.*

(Continued)

*Primary Examiner* — Marc Duncan
(74) *Attorney, Agent, or Firm* — PatentVentures; Bennett Smith; Korbin Van Dyke

(57) ABSTRACT

A system, method, and computer program product are provided for sending failure information from a solid state drive (SSD) to a host device. In operation, an error is detected during an operation associated with a Serial ATA (SATA) solid state drive. Additionally, a command is received for failure information from a host device. Further, the failure information is sent from the solid state drive to the host device, the failure information including failure information associated with the solid state drive.

18 Claims, 4 Drawing Sheets

U.S. PATENT DOCUMENTS

| | | | |
|---|---|---|---|
| 2008/0005398 A1* | 1/2008 | Huffman | 710/39 |
| 2010/0067133 A1* | 3/2010 | Ooi | 360/31 |
| 2010/0106905 A1* | 4/2010 | Kurashige et al. | 711/114 |
| 2010/0115189 A1* | 5/2010 | Lin et al. | 711/103 |
| 2011/0041005 A1* | 2/2011 | Selinger | 714/6 |
| 2011/0041039 A1* | 2/2011 | Harari et al. | 714/773 |

OTHER PUBLICATIONS

Serial ATA NSSD (NAND based Solid State Drive), Jul. 2008, Samsung, Revision 1.0.*

Intel X25-E SATA Solid State Drive, May 2009, Intel.*

* cited by examiner

SYSTEM, METHOD, AND COMPUTER PROGRAM PRODUCT FOR SENDING FAILURE INFORMATION FROM A SERIAL ATA (SATA) SOLID STATE DRIVE (SSD) TO A HOST DEVICE

FIELD OF THE INVENTION

The present invention relates to memory systems, and more particularly to relaying failure information relating to solid state drives.

BACKGROUND

Currently, when using NCQ (Native Command Queuing) in a Serial ATA (SATA) system and an error occurs, the drive associated with the SATA system stops all activity. The drive will continue only when the drive receives specific information. For example, the drive may continue when the drive receives a COMRESET signaling or SRST information from a host to reset the drive.

As another example, the drive may receive a Read Log Ext 10 command or a Read Log DMA Ext 10 command, where 10 is the page. If the drive receives a Read Log Ext 10 or a Read Log DMA Ext 10 command, then Log 10 is returned to the host. This log may include information about the tag of the command that failed, a local block address (LBA), and a size of the command.

However, in the case of solid state drives (SSDs), the information in this log is not generally useful. The information in the log does not generally contain failure information relevant to an SSD. There is thus a need for addressing these and/or other issues associated with the prior art.

SUMMARY

A system, method, and computer program product are provided for sending failure information from a solid state drive (SSD) to a host device. In operation, an error is detected during an operation associated with a Serial ATA (SATA) solid state drive. Additionally, a command is received for failure information from a host device. Further, the failure information is sent from the solid state drive to the host device, the failure information including failure information associated with the solid state drive.

DETAILED DESCRIPTION

Figure 1:
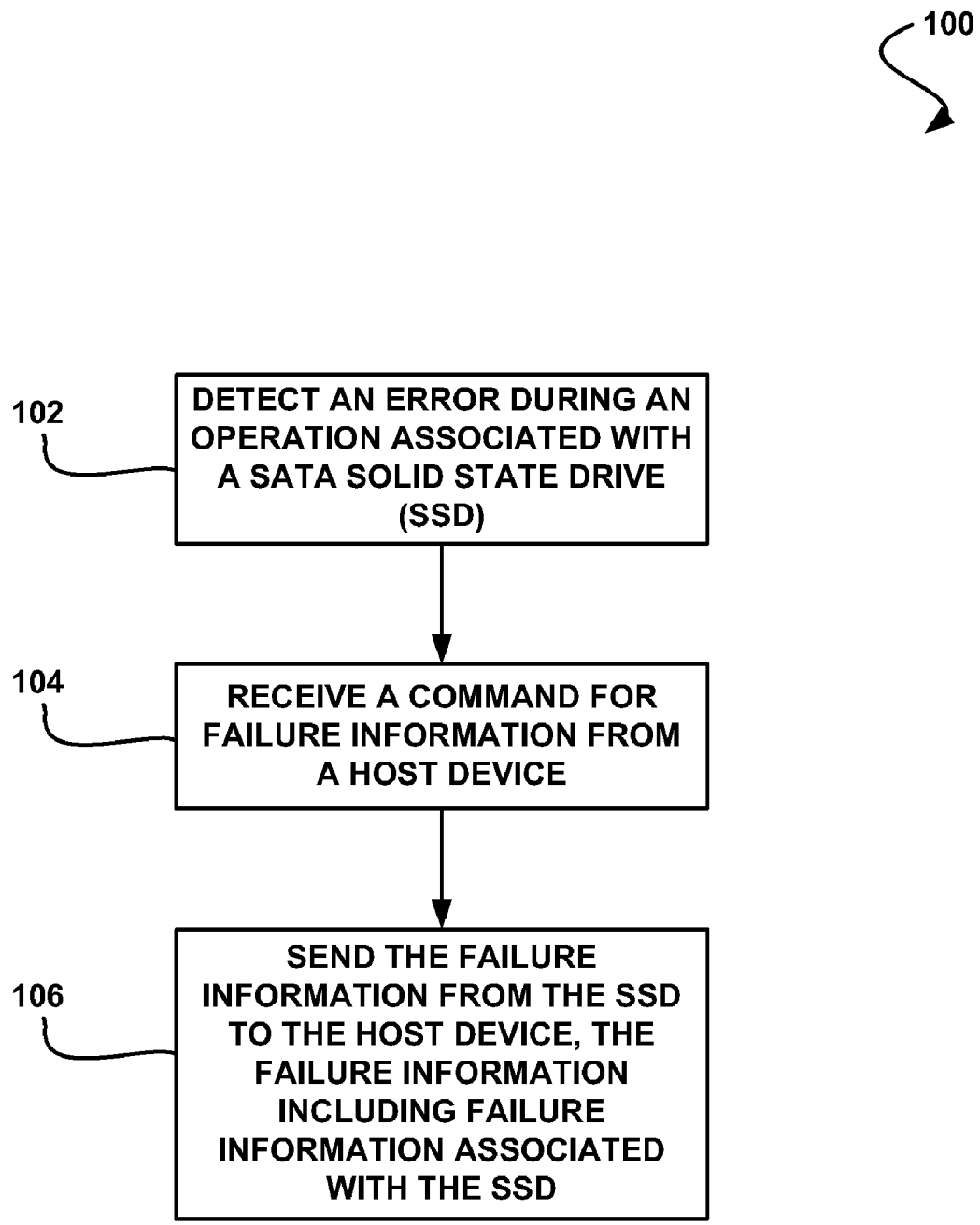
FIG. 1 shows a method for sending failure information from a solid state drive (SSD) to a host device, in accordance with one embodiment.

FIG. 1 shows a method 100 for sending failure information from a solid state drive (SSD) to a host device, in accordance with one embodiment. As shown, an error is detected during an operation associated with a Serial ATA (SATA) SSD. See operation 102.

In one embodiment, the operation associated with the SSD may include a native command queuing (NCQ) operation. In another embodiment, the operation associated with the SSD may include a non NCQ operation. For example, the operation associated with the SSD may include a SATA command.

In the context of the present description, an NCQ operation refers to any NCQ operation or command used in the context of a hard disk drive (HDD) or an SSD or a storage device. For example, in one embodiment, the NCQ operation may include sending an NCQ command to an SSD.

Additionally, a command is received for failure information from a host device. See operation 104. The command may include any command that is capable being used as a request for failure information.

In one embodiment, the failure information may be included in a log page. In this case, the command for failure information may include a request for a log page. Of course, the failure information may be in any form and may not necessarily be included in a log page.

Further, the failure information is sent from the SSD to the host device, the failure information including failure information associated with the SSD. See operation 106. The failure information may include any failure information associated with the SSD. In various embodiments, the failure information may or may not be in a log page format. In one embodiment, the log page may include a log page 10.

Furthermore, the SSD may include any type of SSD. For example, the SSD may include RAM (e.g. SRAM, DRAM, etc.). In another embodiment, the SSD may include flash memory. In this case, the flash memory may include non-volatile flash memory. In various embodiments, the flash memory may include single-level cell (SLC) flash memory and/or multi-level cell (MLC) flash memory. In either case, the SSD may be associated with a SATA system.

The failure information may include any information associated with the error and/or the SSD. For example, in one embodiment, the failure information may include information indicating whether data stored in at least a portion of the SSD is corrupt. In this case, the error may have caused the corrupt data or may have been generated by the corrupt data.

In another embodiment, the failure information may include information indicating a location of the SSD associated with the error. For example, the error may be generated from performing an NCQ operation on a specific portion of memory associated with the SSD. In this case, the failure information may indicate the specific portion of memory and any information associated with that portion or the error.

As another example, the failure information may include information indicating whether the SSD was able to free up space for a command associated with the NCQ operation. For example, the NCQ operation may include a command to the SSD to write data or free up space such that data may be written. If an error occurs as a result of this command, information associated with that error, including whether the SSD was able to free up space for the command, may be included in a log page or in another format of returning failing information.

In one embodiment, the failure information may include information indicating whether the error is associated with a persistent failure or a transient failure. For example, if the error is a reoccurring error, or an error indicative of a reoccurring event, the failure information may indicate a persistent failure. If, however, the error is not a reoccurring error, or is an error indicative of an anomaly, the failure information may indicate a transient failure.

It should be noted that any log page sent as part of the request for failure information may also include information not necessarily associated with the error. For example, in one embodiment, the log page may further include information indicating where the SSD is on a life expectancy curve. As another option, the log page may include vendor specific information. In this case, the vender specific information may include information associated the SSD or a vendor of the SSD.

In another embodiment, the log page may include one or more fields associated with a read log page 10. For example, the log page may include fields and such as device information, logical block address (LBA) information, count information, check sum information, and various other types of information.

In either case, the failure information and/or the log page may be capable of being utilized to recover failure information associated with a command (e.g. an NCQ command, a SATA command, etc.) issued to the SSD. Additionally, the log page may be capable of being utilized to recover failure information associated with a non-queued command issued to the SSD. It should be noted that the command may include any command that is capable of being used to fetch SSD information to recover from an NCQ command and any failure information associated with the NCQ command.

Furthermore, the log page may be accessible utilizing a command to fetch SSD failure information. For example, the log page may be accessible utilizing a Read Log EXT command. As another example, the log page may be accessible utilizing a Read Log DMA command.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
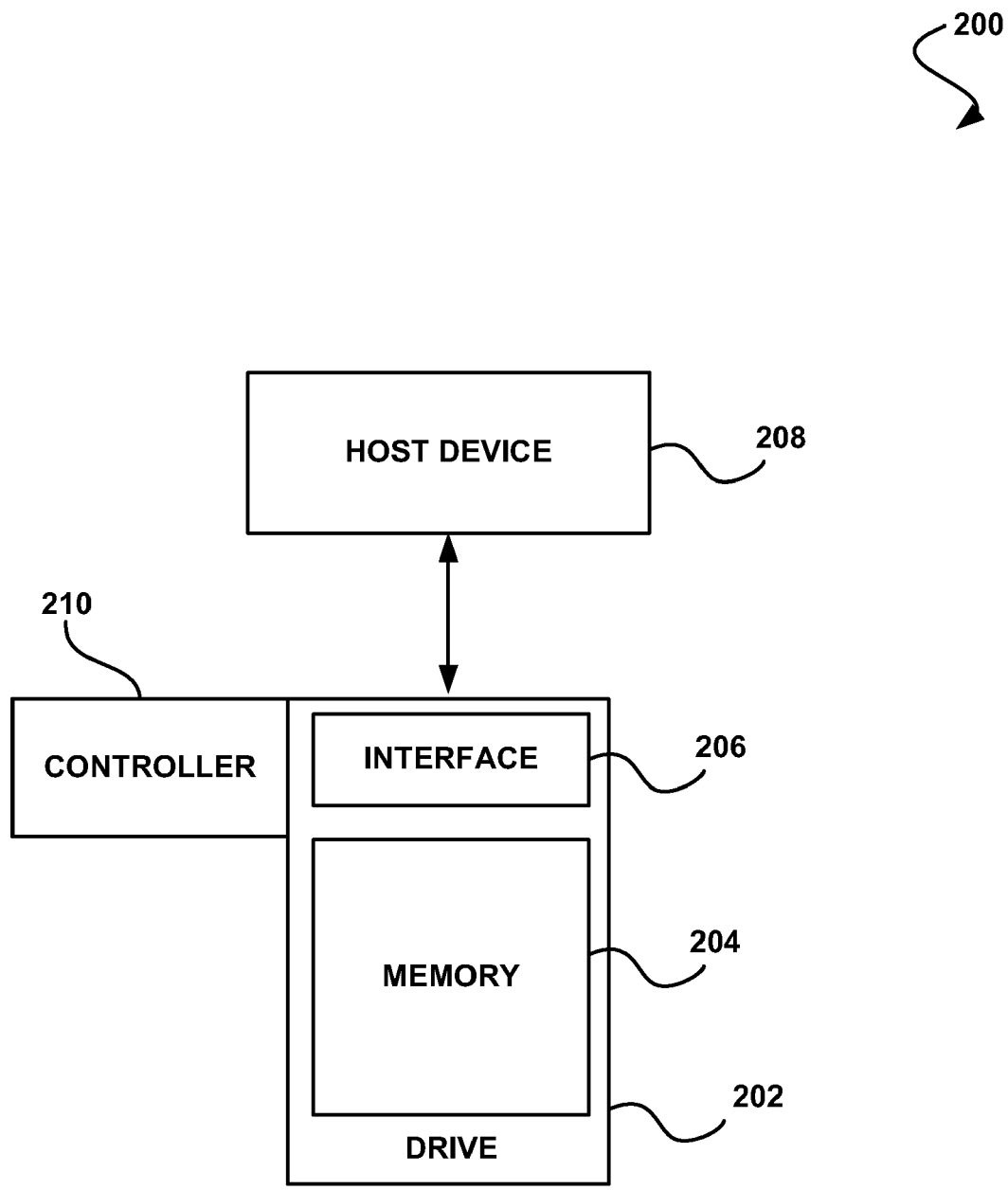
FIG. 2 shows a system for sending failure information from a solid state drive to a host device, in accordance with one embodiment.

FIG. 2 shows a system 200 for sending failure information from a solid state drive to a host device, in accordance with one embodiment. As an option, the present system 200 may be implemented to carry out the method 100 of FIG. 1. Of course, however, the system 200 may be implemented in any desired environment. It should also be noted that the aforementioned definitions may apply during the present description.

As shown, the system 200 includes a solid state drive 202 including memory 204 and an interface 206 for communicating with a host device 208. As shown further, the system 200 may also include a memory controller 210. In various embodiments, the memory controller 210 may be included with the solid state drive 202 or separate from the solid state drive 202.

In operation, an error may be detected during an operation being performed on the solid state drive 202 (e.g. a native command queuing operation, etc.). Additionally, a command may be received for a failure information (e.g. in a log page format, etc.) associated with the solid state drive 202 from the host device 208. As a result of this request, the failure information may be sent from the solid state drive 202 to the host device 208, where the failure information includes failure information associated with the solid state drive 202. In this way, useful failure information may be provided in the log page for errors resulting from commands being sent to the solid state drive 202.

For example, in SATA when using native command queuing and an error occurs, the drive stops all activity. The drive will not normally continue until the drive receives a COMRESET signaling or an SRST information from a host resetting the drive or the drive receives a Read Log Ext 10 command, where 10 is the page, or a Read Log DMA Ext 10 command.

If the drive receives a Read Log Ext 10 command or a Read Log DMA Ext 10 command, then a log 10 page is generally returned to the host. This log may include information about the tag of the command that failed, LBA information, and size of the command, etc.

Table 1 shows an example format of a log page, in accordance with one embodiment.

TABLE 1

| Byte | Description |
| --- | --- |
| 0 | Contains NQ bit, UNL bit, NCQ TAG |
| 1 | Reserved |
| 2 | Status |
| 3 | Error |
| 6-4 | LBA |
| 7 | Device |
| 8-10 | LBA |
| 11 | Reserved |
| 13-12 | Count |
| 14-255 | Reserved |
| 256-510 | Vendor Specific |
| 511 | Checksum |

To date, however, for an SSD, the information in the log has not been useful. For example, in an HDD, the LBA maps to a specific location on the media that does not change. Every time the host writes the LBA, this data goes to the same place. In an SSD, the LBA will go to a different place on the media. Thus, the LBA does not inform the host of where this error occurred.

As another example, in some cases, an error may occur due to the SSD being unable to free up a location on the media to write. This issue does not typically exist in HDD systems. HDD systems use this log to get failure information and decide the appropriate course of action. However, the information in this log does not generally contain failure information relevant to a SSD.

Thus, by using this log page or another log page to provide failure information that is relevant to an SSD, the log page may be utilized to remedy situations causing errors in the context of an SSD. In various embodiments, the failure information that is relevant to an SSD may include information indicating whether the data was bad in the flash, the location in the flash, where the drive is on the life curve, whether the drive was unable to free up space for the command, whether the failure is persistent or transient, and various other information.

In this way, a log page 10 may be used to access SSD failure types of information. This log page 10 may be accessed using a Read Log EXT command, a Read Log DMA EXT command, or any other commands to fetch SSD failure information.

The SSD specific information may be vendor specific, or any other fields of a Read Log 10 command. Furthermore, a log page may be used to recover SSD failure information about an NCQ command. Additionally, the log page may be used to recover SSD failure information about a non-queued command.

Figure 3:
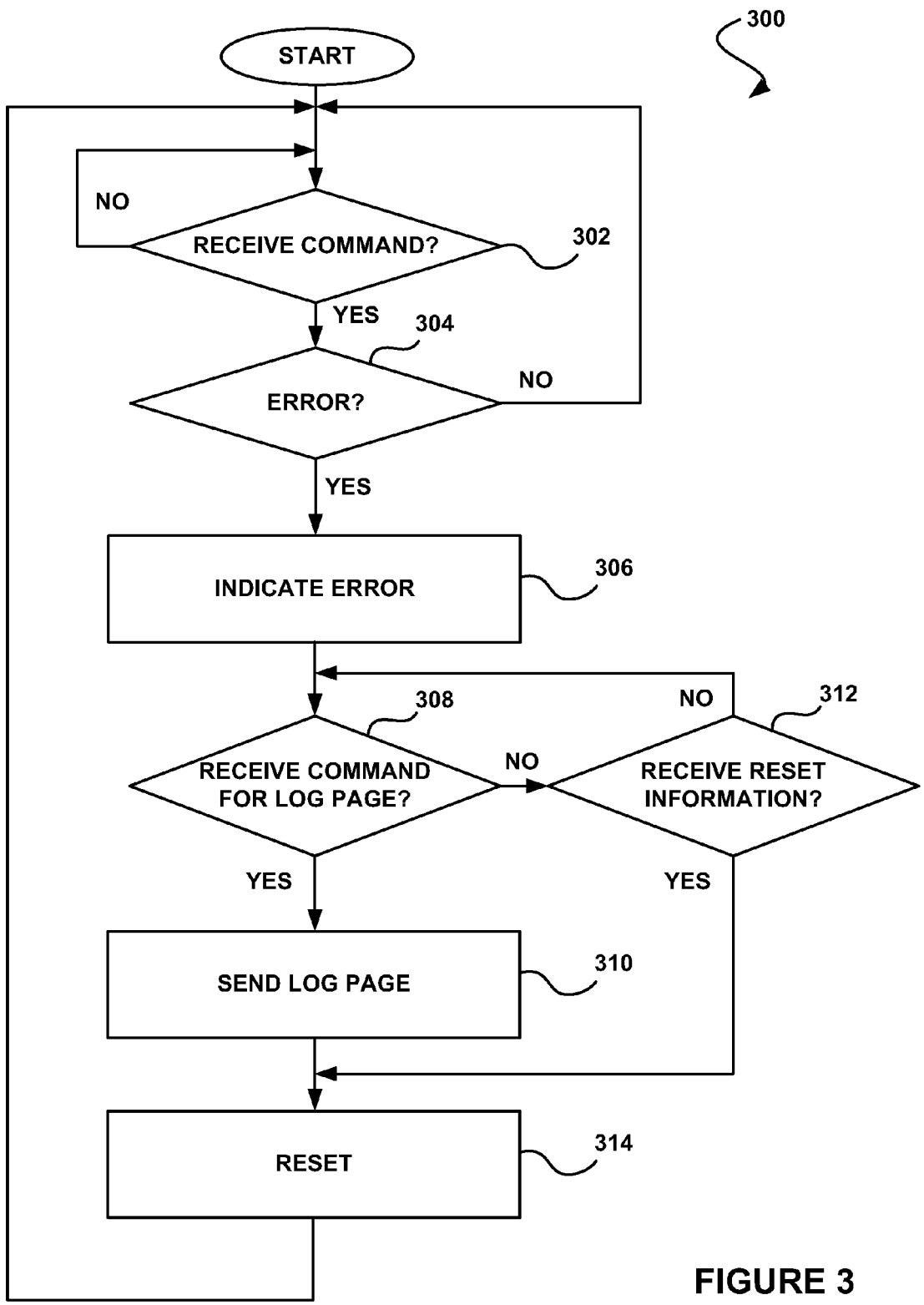
FIG. 3 shows a method for sending failure information from a solid state drive to a host device, in accordance with another embodiment.

FIG. 3 shows a method 300 for sending failure information from a solid state drive to a host device, in accordance with another embodiment. As an option, the present method 300 may be implemented in the context of the functionality and architecture of FIGS. 1-2. Of course, however, the method 300 may be carried out in any desired environment. Again, the aforementioned definitions may apply during the present description.

As shown, it is determined whether an NCQ command, SATA command, or other command is received. See operation 302. If a command is received, it is determined whether an error associated with that command has occurred. See operation 304.

If an error has occurred, the error is indicated. See operation 306. In one embodiment, the error may be indicated by sending an error indication. In another embodiment, the error may be indicated when a response to a command is not received.

It is then determined whether a command for a log page is received. See operation 308. If a command for a log page is received, the log page is sent. See operation 310.

If a command for a log page is not received, it is determined whether reset information is received. See operation 312. If reset information is received, the SSD is reset. See operation 314.

It should be noted that, in one embodiment, both a reset method or/and a command for a log page may be received. For example, a command for the log page may be received and the log page may be sent. Subsequently, a reset method may be received. The SSD may then be reset.

Figure 4:
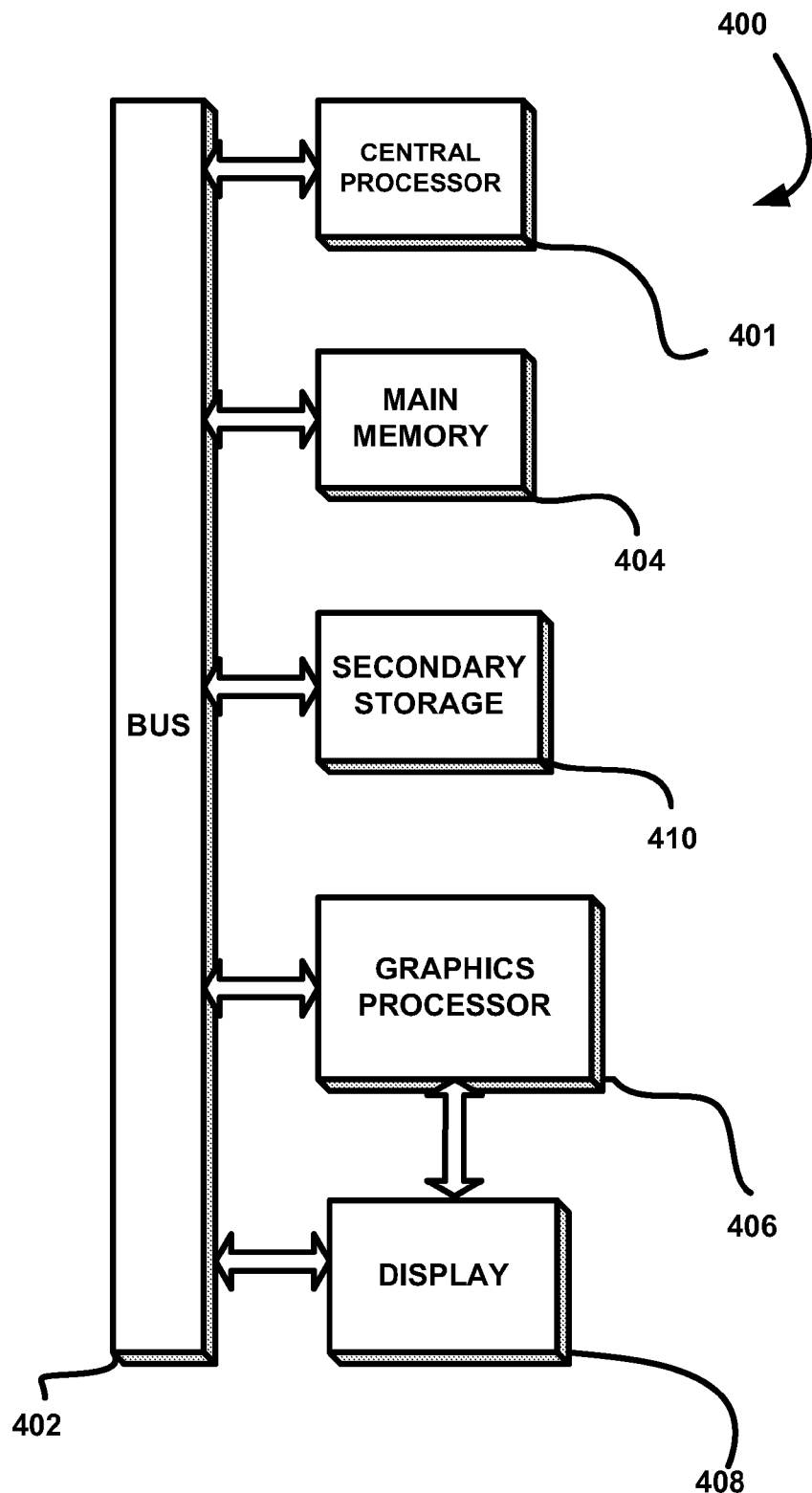
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one host processor 401 which is connected to a communication bus 402. The system 400 also includes a main memory 404. Control logic (software) and data are stored in the main memory 404 which may take the form of random access memory (RAM).

The system 400 also includes a graphics processor 406 and a display 408, i.e. a computer monitor. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the host processor 401, graphics processor 406, an integrated circuit (not shown) that is capable of at least a portion of the capabilities of both the host processor 401 and the graphics processor 406, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, lap-top computer, and/or any other type of logic. Still yet, the system 400 may take the form of various other devices including, but not limited to, a personal digital assistant (PDA) device, a mobile phone device, a television, etc.

Further, while not shown, the system 400 may be coupled to a network [e.g. a telecommunications network, local area network (LAN), wireless network, wide area network (WAN) such as the Internet, peer-to-peer network, cable network, etc.] for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    detecting an error during an operation associated with a Serial ATA (SATA) solid state drive (SSD);
    receiving from a host device a command to return failure information comprising a log page; and
    sending the log page from the SSD to the host device in response to the receiving, the log page comprising at least one log page field comprising information relevant to the SSD being comprised of flash memory as a storage media.

2. The method of claim 1, wherein the at least one log page field comprises a specific storage media location of the flash memory where the error occurred.

3. The method of claim 2, wherein the log page further comprises information indicating whether the specific storage media location of the flash memory is associated with corrupt data.

4. The method of claim 1, wherein the at least one log page field comprises information indicating that the SSD was unable to free up a storage media location of the flash memory in which to write data for the operation.

5. The method of claim 1, further comprising:
    wherein subsequent to a determination that the error is associated with a reoccurring event, the at least one log page field comprises a persistent failure indication; and
    wherein prior to the determination, the at least one log page field comprises a transient failure indication.

6. The method of claim 1, wherein the at least one log page field comprises information indicating where the SSD is on a life expectancy curve.

7. The method of claim 1, wherein the log page is a read log 10 page comprising a vendor specific field and the at least one log page field is the vendor specific field.

8. The method of claim 1, wherein the at least one log page field is one or more of a plurality of fields associated with a read log 10 page.

9. The method of claim 1, wherein the log page is capable of being utilized to recover failure information associated with an NCQ command issued to the SSD.

10. The method of claim 1, wherein the command includes a command that is capable of being used to fetch SSD information to recover from an NCQ command and failure information associated with the NCQ command.

11. The method of claim 1, wherein the failure information is accessible utilizing a command other than a Read Log EXT command or a Read Log DMA command.

12. The method of claim 1, wherein the failure information is accessible utilizing a Read Log EXT command.

13. The method of claim 1, wherein the failure information is accessible utilizing a Read Log DMA command.

14. The method of claim 1, wherein the log page further comprises a format associated with a log page 10.

15. The method of claim 1, wherein the operation includes sending an NCQ command.

16. The method of claim 1, wherein the operation includes sending a SATA command.

17. A computer program product embodied on a tangible computer readable medium, comprising:

computer code for detecting an error during an operation associated with a Serial ATA (SATA) solid state drive (SSD);

computer code for receiving from a host device a command to return failure information comprising a log page; and computer code for sending the log page from the SSD to the host device, the log page comprising at least one log page field comprising information relevant to the SSD being comprised of flash memory as a storage media.

18. An apparatus, comprising:

a Serial ATA (SATA) solid state drive (SSD) configured to:
    detect an error during an operation associated with the SSD;
    receive from a host device a command to return failure information comprising a log page; and
    send the log page from the SSD to the host device, the log page comprising at least one log page field comprising information relevant to the SSD being comprised of flash memory as a storage media.

* * * * *